United States Patent [19]

Hong

[11] Patent Number: 5,039,988
[45] Date of Patent: Aug. 13, 1991

[54] OPTOELECTRONIC DIGITAL TO ANALOG CONVERTER

[75] Inventor: John H. Hong, Moorpark, Calif.

[73] Assignee: Rockwell International Corporation, El Segundo, Calif.

[21] Appl. No.: 275,994

[22] Filed: Nov. 25, 1988

[51] Int. Cl.$^5$ .................................. H03K 13/02
[52] U.S. Cl. ..................... 341/137; 385/37; 385/27
[58] Field of Search ................. 341/137, 13, 14; 350/96.14, 96.15, 96.16

[56] References Cited

U.S. PATENT DOCUMENTS

| | | | |
|---|---|---|---|
| 3,985,423 | 10/1976 | Tseng | 341/137 X |
| 4,288,785 | 9/1981 | Papuchon et al. | 341/137 X |
| 4,542,367 | 9/1985 | Shreve | 341/137 |
| 4,613,204 | 9/1986 | Verber et al. | 341/137 X |
| 4,617,551 | 10/1986 | Ophoff | 341/137 |

FOREIGN PATENT DOCUMENTS

| | | | |
|---|---|---|---|
| 1361718 | 12/1987 | U.S.S.R. | 341/137 |
| 1374432 | 2/1988 | U.S.S.R. | 341/137 |

OTHER PUBLICATIONS

Carl M. Verber et al., Integrated-Optic Digital-Analog Converter, Applied Optics, vol. 22, No. 23, pp. 3677-3678, Dec. 1, 1983.
Carl M. Verber et al., Correlator Based on an Integrated Optical Spatial Light Modulator, Applied Optics, vol. 29, No. 9, pp. 1626-1629, May 1, 1981.
Sybil P. Parker, editor, McGraw-Hill Dictionary of Scientific and Technical Terms, p. 456.

*Primary Examiner*—WIlliam M. Shoop, Jr.
*Assistant Examiner*—Sharon D. Logan
*Attorney, Agent, or Firm*—John J. Deinken

[57] ABSTRACT

A device is provided for converting optical digital signals to electronic analog signals. A light beam is passed through a series of beam splitters. The transmission coefficient of each beam splitter is equal to the reciprocal of the base of the number of the electronic digital input signal. The beam splitters are arranged in series with the light beam so that the reflected portion of the beam is weighted to be proportional to the significance of a place in the binary number corresponding to its beam splitter. The reflected portion of the beam from each beam splitter is separately modulated in response to an input electronic digital signal for the place in the digital number corresponding to its beam splitter. The reflected portions of the beam from each beam splitter are combined and the combined beam is received by a detector which provides an electronic output which is an analog representation of the digital signal.

23 Claims, 2 Drawing Sheets

OPTOELECTRONIC DIGITAL TO ANALOG CONVERTER

STATEMENT OF GOVERNMENT INTEREST

The Government has rights in this invention pursuant to Contract No. F30602-87-C-0198 awarded by the Dept. of the Air Force.

BACKGROUND OF THE INVENTION

This invention relates to digital to analog converters, and particularly to optoelectronic digital to analog converters.

Converting a number in one representation to its analog equivalent is a well known process which is very useful in signal processing. Binary to analog conversion is known as DAC (digital to analog converter). Because of electronic parasitics and other undesirable features in analog integrated circuit technology, the electronic DAC's have been limited typically to speeds less than 200 MHz. Although at present generating binary words (or numbers) of appreciable bit length (for example, 12 bits or more) at speeds higher than the current 200MHz limit is a challenge, it is expected that higher speed DAC technology will become useful in the future.

An integrated optic digital to analog converter has been proposed by Carl M. Verber and B. Thomas Smith in APPLIED OPTICS, Vol. 22, No. 23, pages 3677-3678, Dec. 1, 1983. The active element of the proposed converter is an electrooptic integrated optic spatial light modulator which is an extended interdigital electrode structure composed of a number of separately addressable segments.

SUMMARY OF THE INVENTION

It is an object of the invention to provide an optoelectronic digital to analog converter which is faster than electronic digital to analog converters.

According to the invention, a light beam is passed through a series of beam splitters. The transmission coefficient of each beam splitter is equal to the reciprocal of the base of the number of the electronic digital input signal. The beam splitters are arranged in series with the light beam so that the reflected portion of the beam is weighted to be proportional to the significance of a place in the binary number corresponding to its beam splitter. The reflected portion of the beam from each beam splitter is separately modulated in response to an input electronic digital signal for the place in the digital number corresponding to its beam splitter. The reflected portions of the beam from each beam splitter are combined and the combined beam is received by a detector which provides an electronic output which is an analog representation of the digital signal.

In a first embodiment of the invention, separate light sources are coupled to the incoming electronic digital signal for each place in the incoming digital number. Separate optical waveguides carry the light from each light source to a single summing waveguide. These waveguides are coupled to the single summing waveguide by means of beam splitters. Each beam splitter has an intensity transmission equal to the reciprocal of the base of the particular electronic digital input signal. For example in the binary system, the intensity transmission of each beam splitter would be 0.5.

The beam splitters are coupled to the summing optical waveguide in series so that the optical digital output signal from the light source representing the least significant place passes through all the beam splitters. Each optical signal from a more significant place passes through a lesser number of beam splitters down to the optical signal from the most significant place which passes through only one beam splitter. Consequently, the optical signals are weighted according to the place of the incoming electronic digital signal. An optical detector receives the sum of all the signals from the summing waveguide and provides an analog electronic output.

In a second embodiment of the invention, a single light beam is passed through a plurality of beam splitters positioned in series to receive the transmitted portion of the light beam. As in the above described first embodiment, the transmission coefficient of the beam splitters is equal to the reciprocal of the base of the number of the electronic digital input signal. Separate light modulators modulate the reflected portion of the beam. The first reflected beam is modulated in response to an input electronic digital signal for the most significant place in the digital number. The modulator for the following reflected beams are each modulated in response to a corresponding less significant place down to the modulator for the last reflected beam which is modulated in response to an input electronic digital signal for the least significant place. A beam combiner, such as a lens, receives all the reflected, modulated beams and combines them so that an optical detector can receive the sum of the optical signals and provide an analog electronic output.

These and other objects and features of the invention will be apparent from the following detailed description taken with reference to the accompanying drawings.

DESCRIPTION OF THE INVENTION

Given a binary word of length N (a binary number of N places) which is represented by the stream of bits $x_0, x_1, x_2, x_3, ...x_{N-1}$, the problem is to find its analog equivalent, say A, which is given by:

$$A = \sum_{k=0}^{N-1} 2^k x_k; \qquad \text{(Equation 1)}$$

where $x_0$ is the least significant bit (or place in the binary number).

Figure 1:
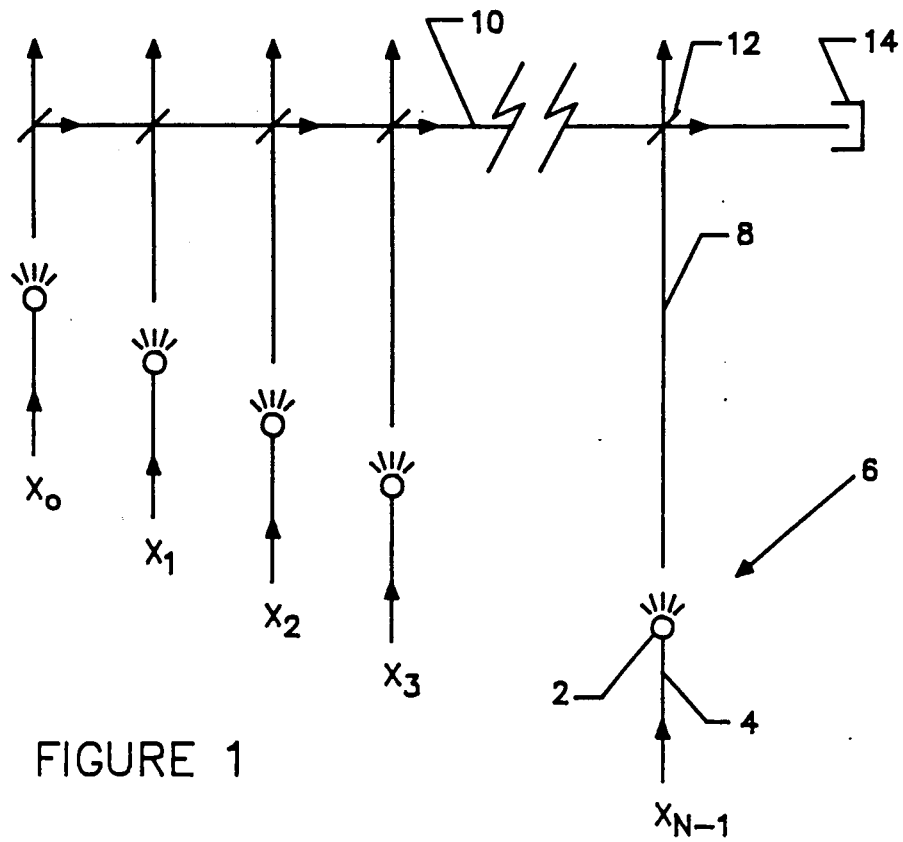
FIG. 1 is a schematic of the optoelectronic digital to analog converter.

FIG. 1 is a schematic of the optoelectronic circuit of the invention for converting a binary number to an analog number and thus solve equation 1 above. Each light source 2 is driven by the appropriate binary bit signal 4. The light sources 2 which convert the incoming electrical binary signals to optical signals 6 can be high speed light emitting diodes or laser diodes.

Separate waveguides 8 are provided to transmit optical signals 6 to a summing waveguide 10. Beam splitters 12 are provided for each waveguide in order to couple the optical signal into the summing waveguide. As shown in FIG. 1, each beam splitter couples a separate waveguide to the summing waveguide. The beam splitters are arranged in series so that the optical digital output signal from the light source representing the least significant place in the digital number passes through all the beam splitters, and each optical signal from a more significant place passes through a lesser number of beam splitters down to the optical signal from the most significant place which passes through only one beam splitter.

Each beam splitter 12 has an intensity transmission coefficient, T, which is equal to the reciprocal of the base of the electronic digital input signal; and an intensity reflection coefficient, R. In this way, the light contribution from the least significant bit source is attenuated by the factor $RT^{N-1}$. In a similar way, the second least significant bit source is attenuated by the factor $RT^{N-2}$. The light contribution from each waveguide is thus summed in waveguide 10 and transmitted to a detector 14 which converts the summed optical signal to an analog electronic signal. Depending upon the application, detector 14 can be selected to provide either an output voltage signal or an output amperage signal.

To be concise, the optical power that detector 14 sees (and hence the output voltage) is given by:

$$P = \sum_{k=0}^{N-1} RT^{N-1-k} P_k; \quad \text{(Equation 2)}$$

where $P_k$ represents the amount of power contributed by the $k^{th}$ source and is equal to a fixed finite amount or zero depending on its corresponding binary bit. Clearly if T is selected to equal 0.5, equation 2 gives the analog equivalent of the binary word to within a constant scale factor which can be taken care of after detection, or by properly adjusting the power levels of the light sources.

Figure 2:
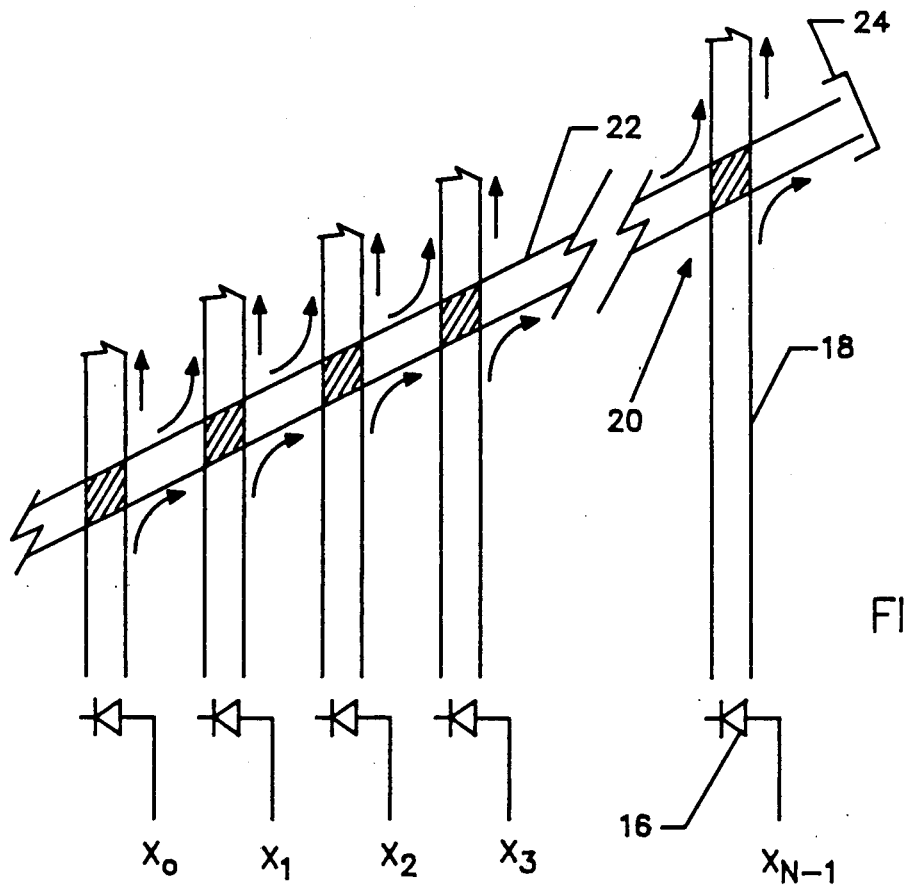
FIG. 2 is a schematic of an integrated realization of the optoelectronic digital to analog converter shown in FIG. 1.

FIG. 2 is a schematic of an integrated embodiment of the invention formed on a semiconductor chip using known solid state electronic technology. Light sources 16 are light emitting diodes or lasers which are integrated on the chip. The optical waveguides are channel waveguides 18 formed in the chip. Grating couplers 20 are used to split the beam and couple the reflected portion into summing channel waveguide 22. These would be 3 dB couplers for conversion of binary base numbers. The sum of the optical signals reflected into the channel waveguide is received by integrated detector 24 which provides the analog electronic signal corresponding to the incoming binary signal.

Figure 3:
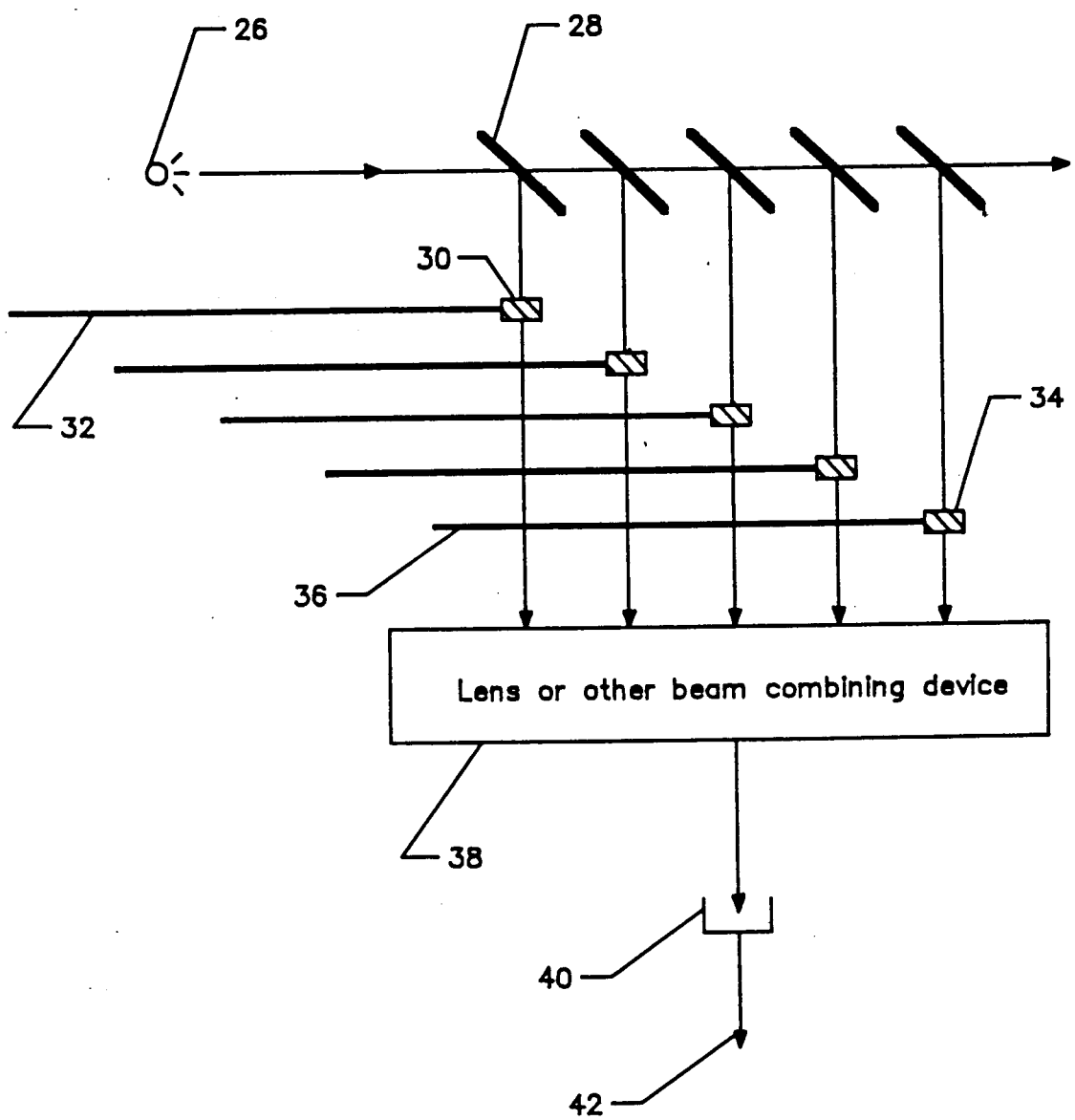
FIG. 3 is a schematic of another embodiment of the invention.

FIG. 3 shows an embodiment of the invention which requires only a single light source 26. The beam from this source is passed through a series of beam splitters 28. As in the earlier described embodiment, the transmission coefficient of the beam splitters is equal to the reciprocal of the base of the digital number which is being converted to an analog. Thus, each beam splitter receives a beam which is reduced in intensity from the beam received by the previous beam splitter. As a result, the reflected portion of the beam is weighted in accordance with it corresponding place in the digital number. For a binary system (transmission coefficient of 0.5), the first beam has ½ the power, the second beam has ¼ the power, etc. to the last beam which has ½ raised to the $N^{th}$ power (where the incoming beam is split into N beams by the succession of identical beam splitters).

A separate light modulator 30 such as an electrooptic modulator (Pockel's cell) is provided for each place in the digital number. The electronic signal 32 representing the most significant place of the digital number is transmitted to the first modulator 30 which modulates the most intense reflected beam. The modulators for the following reflected beams each modulate their beam in response to a corresponding less significant place down to the modulator 34 for the last reflected beam which is modulated in response to an input electronic digital signal 36 for the least significant place of the number. All the reflected, modulated beams are combined in a lens 38 or other beam combining device (such as photodetector 40), and the combined output is received by a high speed photodetector 40 to provide an electronic analog output corresponding to the digital input to the converter.

An advantage of this invention is that it is not limited to binary to analog conversion. It is equally applicable to digital numbers of ternary or higher bases by choosing the value of the beam splitter transmission coefficient (T) to be equal to the reciprocal of the base of the number system used. For example, to convert quaternary numbers (base 4), beam splitters having a transmission coefficient of 0.25 would be used.

The digital to analog converter described here is potentially very fast because the speed is limited only by the speeds of the light sources or of the detector, whichever is slower. Because both laser diodes and detectors have bandwidths exceeding 5 GHz, this converter should be able to operate at such speeds.

The dynamic range required by the converter is exponential in the number of bits. For N=12, this translates to a requirement of $2^{12}=4096$ which is 36 dB. This range is well within the realm of existing detector technology.

The light sources are not constrained by dynamic range problems because they are driven at binary levels.

This digital converter will be useful when very high speed (greater than 400 MHz) digital to analog conversion is required. One immediate application of the converter is the digital synthesis of waveforms at very high rates. In such application, a fast counter accesses a digital waveform stored in an equally fast ROM (read only memory) which then drives the digital to analog converter to create a waveform whose amplitude is synthesized, in principle, to an accuracy of 4096 grey levels. Such an accomplishment at 1 GHz rates, for example, is a remarkable advance.

The preferred embodiments of this invention have been illustrated by the examples described above. Modifications and additional embodiments, however, will undoubtedly be apparent to those skilled in the art. For example, in some applications, the summed optical signal from the last beam splitter may be used directly without a detector, or processed additionally before converting to electrical signals in a detector. Furthermore, equivalent elements may be substituted for those illustrated and described herein, and certain features of the invention may be utilized independently of other features. Consequently, the exemplary embodiments should be considered illustrative, rather than inclusive, while the appended claims are more indicative of the full scope of the invention.

What is claimed is:

1. An optoelectronic digital to analog converter comprising:
   an input electronic digital signal represented by a digital number of N places;
   a source of a light beam;

a plurality of beam splitters each having a transmission coefficient and positioned to divide the light beam into a transmitted portion and a reflected portion, the transmission coefficient of each beam splitter being equal to a reciprocal of a base of the digital number of the electronic digital input signal, the beam splitters being arranged in series with the light beam so that the reflected portion is weighted to be proportional to a place in the digital number corresponding to a respective beam splitter;

means for separately modulating the reflected portion of the beam from each beam splitter in response to an input electronic digital signal for the place in the digital number corresponding to a respective beam splitter; and a means for summing the modulated reflected portions of the beam from each beam splitter to provide an optical output which is the analog of the input electronic digital signal.

2. The optoelectronic digital to analog converter as claimed in claim 1 including a detector coupled to the means for summing to receive the sum of all optical output signals and to provide an electronic output which is proportional to the sum.

3. The optoelectronic digital to analog converter as claimed in claim 1 including an optical waveguide for the light beam.

4. The optoelectronic digital to analog converter as claimed in claim 1 wherein:

the source of a light beam comprises a plurality of light beam sources and a plurality of optical waveguides, each waveguide being coupled to a separate light beam source to receive a separate light beam;

the means for summing the reflected portions of the beam comprises a summing optical waveguide;

each of the beam splitters couples a separate waveguide to the summing waveguide in series so that the optical output signal from the light source representing the least significant place of the digital number is reflected into the summing waveguide and then passes through all the beam splitters, and each optical signal from a more significant place is reflected into the summing waveguide and passes through a lesser number of beam splitters down to the optical signal from the most significant place which passes through only one beam splitter; and the means for separately modulating comprises separate electronic inputs to each of the light beam sources for modulating each light beam source.

5. The optoelectronic converter as claimed in claim 1 wherein:

the beam splitters are positioned in series to receive the transmitted portion of the light beam and to reflect a portion of the light beam from each beam splitter;

the means for modulating comprises a separate modulator for each place in the digital number, each modulator receiving the reflected portion of the light beam from a corresponding beam splitter; and the means for summing receives the reflected and modulated light beam.

6. An optoelectronic digital to analog converter comprising:

a plurality of light sources for receiving electronic digital input signals and converting the electronic digital input signals to optical digital output signals;

a plurality of optical waveguides, each waveguide being coupled to a separate light source to receive the optical digital output signals from a respective light source;

a summing optical waveguide; and a plurality of beam splitters having an intensity transmission coefficient equal to a reciprocal of a digital base of the number of the electronic digital input signal, each beam splitter coupling a separate waveguide to the summing waveguide in series so that the optical digital output signal from the light source representing a least significant place of the digital number passes through all the beam splitters, and each optical signal from a more significant place passes through a lesser number of beam splitters down to the optical signal from the most significant place which passes through only one beam splitter.

7. The optoelectronic digital to analog converter as claimed in claim 6 including a detector coupled to the summing waveguide to receive the sum of all the optical digital output signals and to provide an electronic output which is proportional to the sum.

8. The optoelectronic digital to analog converter as claimed in claim 6 wherein the light sources comprise light emitting diodes.

9. The optoelectronic digital to analog converter as claimed in claim 6 wherein the light sources comprise lasers.

10. The optoelectronic digital to analog converter as claimed in claim 6 wherein: the converter is integrated on a semiconductor chip.

11. The optoelectronic digital to analog converter as claimed in claim 10 wherein the waveguides comprise channel waveguides, and the beam splitters comprise grating couplers.

12. The optoelectronic digital to analog converter as claimed in claim 6 wherein the electronic digital input signal is a binary input signal and the intensity of transmission of the optical splitters is 0.5.

13. An optoelectronic digital to analog converter comprising:

a electronic digital input signal represented by a digital number of N places a source of a light beam;

a plurality of beam splitters each having a transmission coefficient and positioned in series to receive the transmitted portion of the light beam and to reflect in parallel the reflected portion of the light beam from each splitter, the transmission coefficient of the beam splitters being equal to a reciprocal of the base of a number of the electronic digital input signal;

separate modulators for modulating the reflected portion of the beam from each beam splitter, the modulator for the first reflected beam modulating a respective beam in response to an input electronic digital signal for the most significant place in the digital number and the modulators for the following reflected beams each modulating an beam in response to a corresponding less significant place down to the modulator for the last reflected beam which is modulated in response to an input electronic digital signal for the least significant place; and a means for combining all the reflected and modulated beams to provide an optical output which is an analog of the input electronic digital signal.

14. The optoelectronic digital to analog converter as claimed in claim 13 including an optical waveguide for the light beam.

15. The optoelectronic digital to analog converter as claimed in claim 13 including a detector which receives the combined optical output and provides an electronic output which is an analog of the input electronic digital signal.

16. The optoelectronic digital to analog converter as claimed in claim 13 wherein the moduors comprise electrooptic modulators.

17. The optoelectronic digital to analog converter as claimed in claim 13 wherein the means for combining comprises a lens.

18. The optoelectronic digital to analog converter as claimed in claim 15 wherein the detector also comprises the means for combining.

19. The optoelectronic digital to analog converter as claimed in claim 13 wherein the light source comprises a laser.

20. The optoelectronic digital to analog converter as claimed in claim 13 wherein the light source comprises a light emitting diode.

21. The optoelectronic digital to analog converter as claimed in claim 13 wherein the electronic digital input signal is a binary input signal and the intensity transmission coefficient of the optical splitters is 0.5.

22. The optoelectric digital analog converter as claimed in claim 14 wherein the converter is integrated on a semiconductor chip.

23. The optoelectronic digital to analog converter as claimed in claim 22 wherein: the waveguide comprises a channel waveguide in the chip, and the beam splitters comprise grating couplers.

* * * * *